(12) United States Patent
Stagnitto et al.

(10) Patent No.: US 6,729,927 B2
(45) Date of Patent: May 4, 2004

(54) METHOD AND APPARATUS FOR MAKING A SHADOW MASK ARRAY

(75) Inventors: Joseph E. Stagnitto, Rochester, NY (US); Thomas W. Palone, Rochester, NY (US); Camiel J. Raes, Phelps, NY (US); James A. White, Conesus, NY (US); Joseph Yokajty, Webster, NY (US); Gopalan Rajeswaran, Fairport, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/210,687

(22) Filed: Aug. 1, 2002

(65) Prior Publication Data

US 2004/0021410 A1 Feb. 5, 2004

(51) Int. Cl.$^7$ .................................................. H01J 29/07
(52) U.S. Cl. ............................. 445/47; 445/37; 445/30; 445/68
(58) Field of Search ............................. 445/37, 47, 30, 445/68; 313/402–407

(56) References Cited

PUBLICATIONS

U.S. Ser. No. 09/893,250, Filed: Jun. 27, 2001, Entitled: Alignment Device which Facilitates Deposition of Organic Material Through a Deposition Mask, by Thomas K. Clark.

U.S. Ser. No. 09/994,095, Filed: Nov. 26, 2001, Entitled: Aligning Mask Segments to Provide a Stitched Mask for Producing OLED Devices, by Thomas K. Clark, et al.

U.S. Ser. No. 10/016,451, Filed: Dec. 10, 2001, Entitled: Aligning Mask Segments toProvide an Assembled Mask for Producing OLED Devices. by Thomas K. Clark.

*Primary Examiner*—Kenneth J. Ramsey
*Assistant Examiner*—Joseph Williams
(74) *Attorney, Agent, or Firm*—Susan L. Parulski; Mark G. Bocchetti

(57) ABSTRACT

A method for making a shadow mask array is taught. Producing a plurality of shadow mask sections; inspecting the plurality of shadow mask sections to determine which shadow mask sections are acceptable as meeting predetermined criteria; positioning a predetermined number of the acceptable mask sections into predetermined locations relative to one another to form a mask section array thereby distributing any error in individual mask sections across the mask section array; and attaching the individual mask sections of the mask section array to a support structure. The support structure allows for expansion and/or contraction of the individual mask sections of the mask section array while maintaining relative positioning of the individual shadow mask section in the shadow mask array. The support structure further allows for compliance of the shadow mask array in a direction normal to the plane of the shadow mask array thereby allowing for a substantially planar interface between the shadow mask array and a substrate to be coated.

14 Claims, 7 Drawing Sheets

METHOD AND APPARATUS FOR MAKING A SHADOW MASK ARRAY

FIELD OF THE INVENTION

The present invention relates generally to the production of shadow masks and, more particularly, to a method of assembling a plurality of shadow mask sections for fabricating a larger-sized shadow mask.

BACKGROUND OF THE INVENTION

The use of shadow masks for precision patterning is a well-known art. Due to the ever-increasing need for higher resolution displays, greater shadow mask dimensional accuracy is desirable. One of biggest factors that adversely affects said dimensional accuracy is temperature changes due to thermal expansion. Temperature changes during mask manufacturing, as well as during the deposition process, result in shadow mask dimensional errors especially for larger-sized shadow masks.

In the manufacturing of organic light emitting diode (OLED) displays, shadow masks are used to pattern the electroluminescent coatings onto a substrate. Typically these shadow masks are fabricated using one of a number of different manufacturing processes. The two most common mask manufacturing methods are electroforming and etching. In order to reduce manufacturing costs of an OLED display, the displays are fabricated in a batch-type process in which many displays are fabricated on a single substrate and then separated with a scribing and breaking process. Generally speaking, the larger the substrate the lower the unit cost of the display. To pattern coatings on larger substrates a larger mask is used. Unfortunately current mask manufacturing processes do not permit fabrication of larger-sized shadow masks with the desired level of precision and quality.

The need for higher resolution displays also creates the need to manufacture masks with smaller coating apertures that permit smaller pixels sizes in an OLED display. Using either the electroforming or etching manufacturing processes, fabricating larger size masks with very small coating apertures becomes difficult due to the increased likelihood that the mask will possess quality defects. The present invention overcomes the dimensional inaccuracies and quality issues of a larger-sized shadow mask for the manufacturing of high-resolution displays.

Currently, fabrication of OLED displays is accomplished with a series of vapor deposition processes to apply thin coatings of material to a substrate such as a piece of glass. To create a pattern within the coating, a shadow mask is placed over the surface to be coated. To obtain the best pattern "image", the shadow mask is kept as thin as possible and is held in Intimate contact with the surface to be coated during the deposition process. One means used to facilitate contact between the shadow mask and substrate is to fabricate the shadow mask from a thin ferromagnetic material by means of electroforming or chemical etching and then place a permanent magnet in close proximity to the substrate side opposite the shadow mask. If movement of the shadow mask is not impeded in a direction normal to the substrate surfaces and the shadow mask possesses no permanent deformations (e.g. wrinkles), then the desired contact between the shadow mask and substrate is achieved.

Typically shadow masks are mounted to a rigid mask frame. The primary functions of the rigid mask frame are to (1) provide structural integrity needed to handle shadow masks either manually or with automated equipment without causing damage to the mask, (2) provide a means to handle and align the shadow mask to existing patterns on the substrate, and (3) provide a means to support the shadow mask with a limited amount of mask sag when held in a horizontal orientation (by bonding the perimeter of the mask to the rigid frame).

SUMMARY OF THE INVENTION

It is therefore an object of the present invention to provide a method for fabricating large shadow masks by precisely interconnecting a plurality of shadow mask sections to form a single shadow mask array.

It is a further object of the present invention to provide a method for fabricating large shadow masks which distributes error in individual mask sections across the entire mask assembly thereby achieving better accuracy across the mask section array than that which could be achieved from a full-sized one-piece mask.

Yet another object of the present invention is to provide a method of fabrication of a shadow mask that is dimensionally more precise and comprises fewer defects as compared to a shadow mask fabricated as a single larger sheet.

Briefly stated, the foregoing and numerous other features, objects and advantages of the present invention will become readily apparent upon a review of the detailed description, claims and drawings set forth herein. These features, objects and advantages are accomplished by providing a method for making a shadow mask array comprising the steps of producing a plurality of shadow mask sections; inspecting the plurality of shadow mask sections to determine which shadow mask sections are acceptable as meeting predetermined criteria; positioning a predetermined number of the acceptable mask sections into predetermined locations relative to one another to form a mask section array thereby distributing any error in individual mask sections across the mask section array; and attaching the individual mask sections of the mask section array to a support structure. The support structure allows for expansion and/or contraction of the individual mask sections of the mask section array while maintaining relative positioning of the individual shadow mask section in the shadow mask array. The support structure further allows for compliance of the shadow mask array in a direction normal to the plane of the shadow mask array thereby allowing for a substantially planar interface between the shadow mask array and a substrate to be coated.

The use of smaller mask sections permits the ability to sort out poor quality mask sections prior to assembling the mask sections into a larger mask. This practice results in an overall higher yield of good shadow masks for a given amount of mask material fabricated. Only the mask section is discarded and not the entire shadow mask when a defect is detected. This practice results in further overall cost reduction since only the mask section containing the defect is discarded and replaced. Further,.the likelihood of producing smaller masks without defects is much greater than producing larger masks without defects.

The set or plurality of smaller shadow mask sections are arranged adjacent to each other and bonded to each other thereby forming a mask array. Preferably, the mask sections forming the array are also bonded to a perimetric support structure. Bonding may be performed with an adhesive, or by soldering, brazing or welding.

The total amount of dimensional error in shadow masks that are larger than about 250 mm square can be reduced with the present invention. This is achieved by precisely arranging smaller, more accurate mask sections to form a large mask array. In this way, the accumulation of dimensional error across the entire width and length of the mask array due to mask fabrication variability can be minimized. In addition, the ability to adjust the positioning of each mask section during the assembly process permits compensation for any dimensional error present within the individual mask sections.

In addition to the rigid perimetric support structure or frame, a set of tensioned bands are attached across the opening of a frame. The tensioned bands provide support structure to which individual mask sections may be directly attached in the frame aperture. The tension bands provide the underside mask support needed to prevent excessive mask sag when held in a horizontal orientation while being aligned to the substrate. Unlike the rigid support structure, the tension bands are light in weight and minimize the obstruction of the shadow mask from said vapor deposition source. In a preferred embodiment of the present invention, a predetermined number of tension bands for use with one rigid perimetric support structure or frame are fabricated as a single sheet that will be referred to herein as a band matrix.

Given the nature of this tension band arrangement, mask sections may be mounted to the tension bands at specific attachment point locations that reduce the maximum movement of points on the shadow mask due to a mask temperature increase. In effect, each mask section is constrained in a way to cause thermal expansion to occur about each mask section center instead of expansion about the center of the entire shadow mask. Therefore, in the case where the shadow mask comprises an array of four mask sections, the movement of points on the shadow mask with respect to the mask frame can be reduced by approximately one half.

BRIEF DESCRIPTION OF THE DRAWINGS

FIG. 6b is an enlarged view of the area within circle A of FIG. 6A showing an exemplary fiducial aperture.

FIG. 6c is an enlarged view of the area within circle B of FIG. 6A showing an exemplary alignment mark.

DETAILED DESCRIPTION OF THE INVENTION

Figure 1:
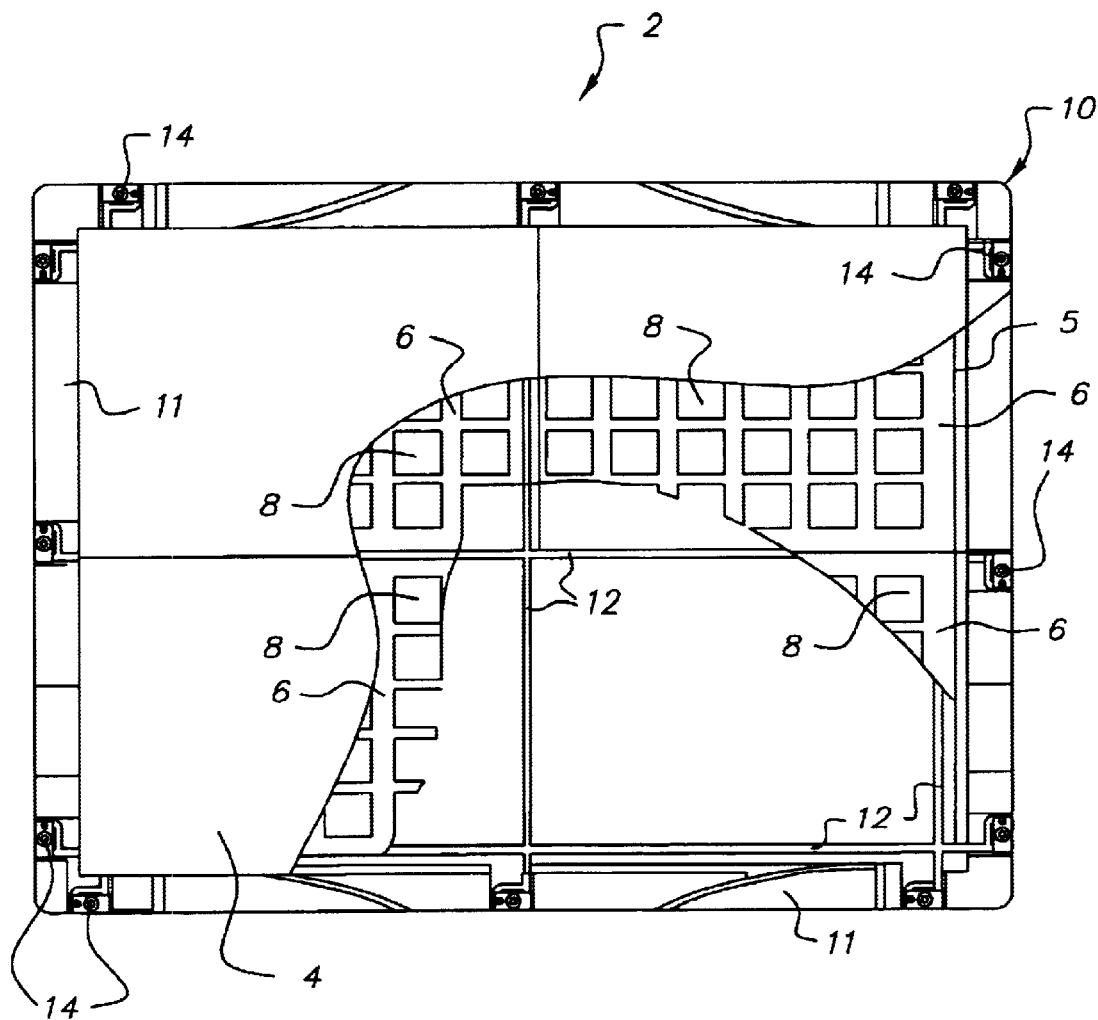
FIG. 1 is a top plan view of an exemplary shadow mask assembly of the present invention shown in combination with a (partially cutaway) substrate to be coated.
Figure 4:
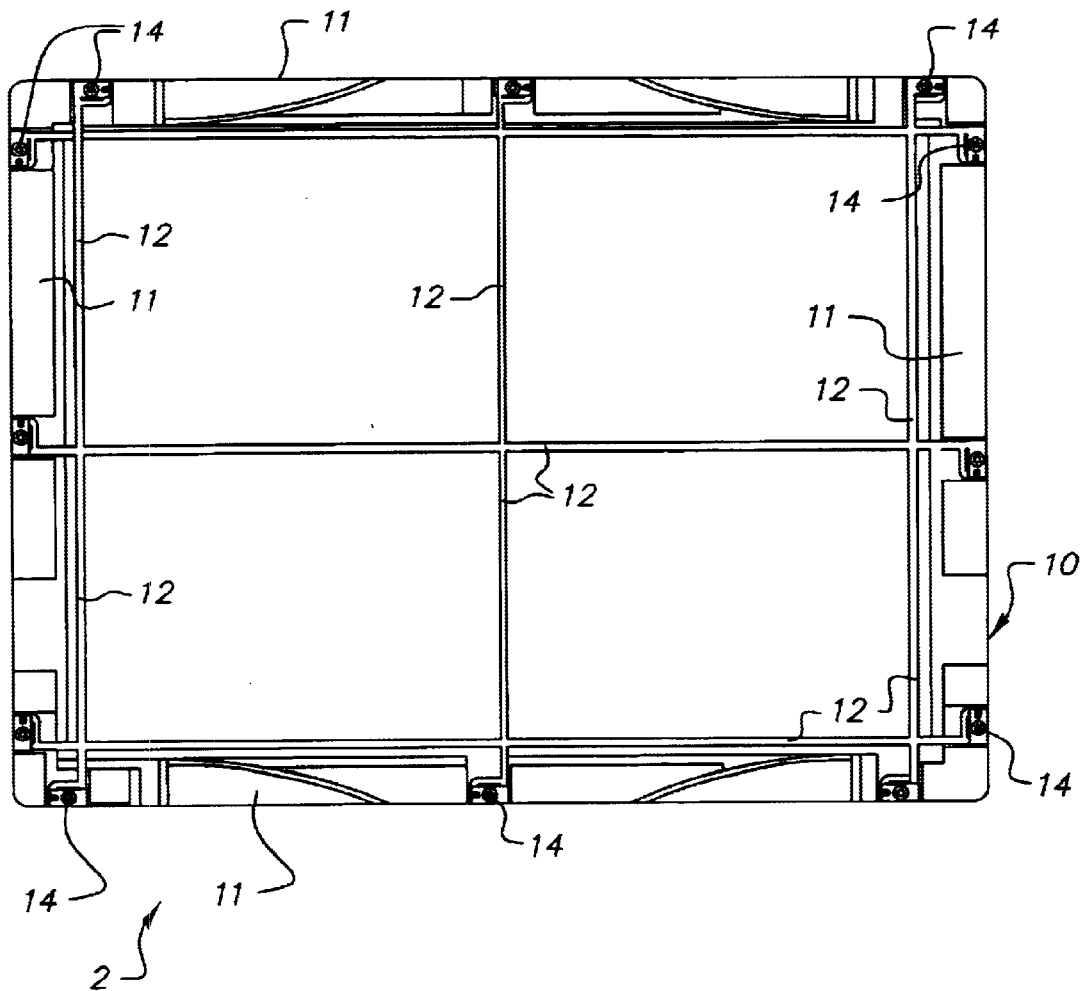
FIG. 4 is a top plan view of the frame assembly including the frame, the clamps, and the band matrix.

Turning first to FIG. 1 there is depicted an exemplary shadow mask assembly 2 made with the method of the present invention. Shadow mask assembly 2 is shown in combination with a (partially cutaway) substrate 4 to be coated. The exemplary shadow mask array (partially cut away) 5 comprises four individual shadow mask sections 6, each shadow mask section having a pattern of coating apertures 8 therethrough. The shadow mask sections 6 are mounted within a frame assembly 10 (shown with the shadow mask sections 6 removed therefrom in FIG. 4). The frame assembly 10 comprises a rigid frame 11, a set of tensioned bands 12, and a set of clamps 14. Clamps 14 engage the tensioned bands 12 to hold the tensioned bands 12 taut within the frame 11. The individual bands 12 are also interconnected to one another at the locations where the bands 12 intersect thereby forming a band matrix. Shadow mask sections 6 are attached to the tensioned bands 12 at a number of points 16 (see FIG. 2) along the perimeters of each mask section 6. Mask coating apertures 8 permit deposition of the desired patterned coating on the substrate 4 during a deposition process. Unlike the thicker and rigid support frame 10, the tension bands 12 provide the needed support for the mask array 5 while minimizing obstruction of the wide dispersion angle of the vapor deposition process.

Each tension band 12 may be a single element connected at each end thereof to a clamp 14 support on the frame 11. However, for ease of fabrication, the tensioned bands 12 can be made a single sheet of material such as, for example, Invar 36 to form an integral band matrix. If an integral band matrix is used, then the bands 12 of the matrix are inherently attached to each other at each intersection. The band matrix becomes one integrally formed element, which may be referred to as a mask support sheet.

Figure 2:
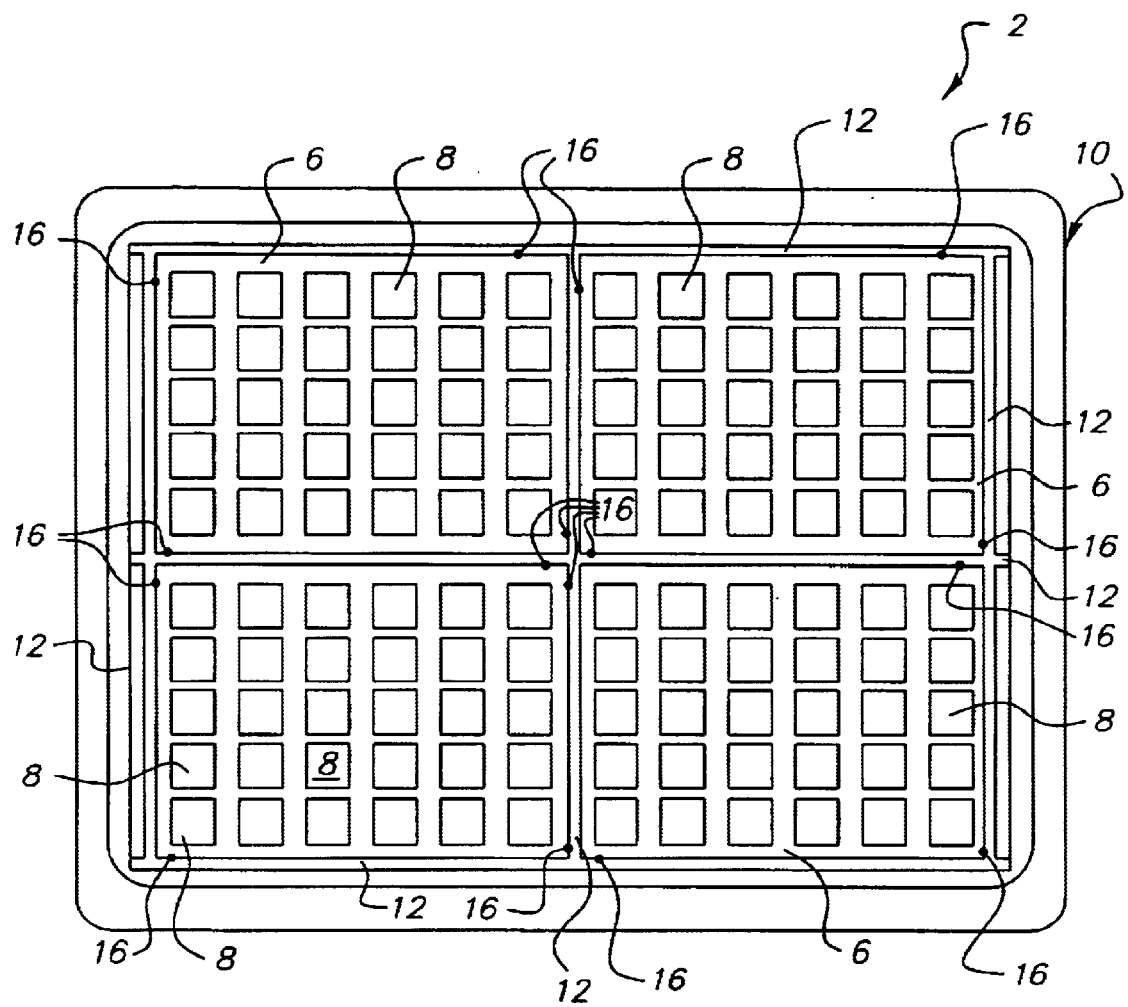
FIG. 2 is a bottom plan view of an exemplary shadow mask assembly of the present invention.

Each mask section 6 as shown in the exemplary shadow mask assembly 2 of FIG. 2 is attached to the tension bands 12 of the mask support sheet in four locations 16. With the arrangement of mask section attachment points 16 shown in FIG. 2, the mask support sheet (the matrix of tension bands 12) provides a means to permit each mask section 6 to expand and contract about its respective center when the mask section 6 is subjected to a temperature change. The inherent weakness of each tension band 12 across the width thereof makes mask expansion and contraction possible. With this arrangement, the propensity for a flatly held shadow mask section 6 (and, as a result, the shadow mask array 5) to buckle due to thermal expansion, is dramatically reduced and the magnitude of error that can be caused by such thermal expansion is also reduced. In effect, the tension bands 12 also act as expansion joints for each shadow mask section 6.

Preferably, some number of the bands 12 are arranged orthogonal to the remaining number of bands 12 in the band matrix. As noted above, the tension bands 12 are attached to each other at each intersection of orthogonal band pairs. In this arrangement, each tensioned band 12 exhibits relatively high stiffness along the length thereof (in the tensioned direction) and relatively high flexibility in a direction orthogonal to the tensioned direction. One skilled in the art can use these characteristics in choosing mask section attachment points 16 that will accurately maintain the alignment between mask sections 6 while permitting thermal expansion and contraction of each mask section 6.

Figure 7:
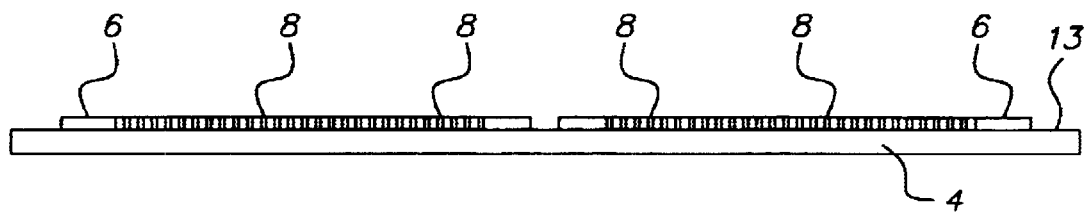
FIG. 7 is a side elevational view showing only shadow mask sections on the substrate to be coated.

As noted above, each band 12 in the support structure exhibits relatively high stiffness along the length thereof in the tensioned direction and relatively high flexibility in a direction orthogonal to the tensioned direction. This property allows the entire band matrix with the attached mask array 5 to have compliance in the direction normal to the plane of the substrate 4 and the shadow mask array 5. This allows the shadow mask array 5 to be easily brought into contact with and conform to the surface of substrate 4. In order to achieve the highest quality deposition pattern through coating apertures 8, it is important to have the shadow mask array 5 in intimate contact with the surface 13 (see FIG. 7) of the substrate 4, which is the surface 13 to be coated. Typically, this is accomplished by actuating a magnetic plate in close proximity to the side of the substrate 4 opposite the side 13 to be coated. To assure mask array 2 contact, the mask sections 6 must be permitted to move freely toward the surface 13 of the substrate 4 to be coated. The use of tension bands 12 to support mask sections 6 results in a shadow mask array 5 that is easily attracted by the magnetic plate toward the surface 13 even if the surface 13 is not perfectly flat or the surface 13 is not held exactly coplanar to the shadow mask array 5 and frame assembly 10.

Tension bands 12 provide a good structure to which mask sections 6 can be attached due to their stability. If a tension band 12 is subjected to a temperature change that does not result in the band "going slack", all points along the band 12 remain essentially fixed with respect to the frame 11 to which they are attached via clamps 14. The magnitude of the tension may change but the position of any point on the band 12 does not shift along the band length due to thermal expansion of the band itself. This is an important feature in maintaining alignment of the shadow mask sections 6 forming the shadow mask array 5.

Note that the tension bands 12 are arranged in a pattern that runs along the edge of each mask section 6 with one set of bands 12 oriented parallel to the length of the frame 11 and one set of bands 12 oriented parallel to the width of the frame 11. At each intersection the orthogonal bands 12 are attached to one another. With this type of arrangement, it should be understood that the points on the band matrix located near the intersections of bands 12 are rigidly constrained with respect to the frame assembly 10 in all directions in the plane of the band matrix assuming that the bands 12 are not compliant along the length thereof. It should also be appreciated that the points on the band matrix furthest away from any intersections of bands 12 are rigidly constrained with respect to the frame 11 only along a direction parallel to the length of the appropriate tension band 12. In the direction parallel to the width of the tension band 12 such furthest away points are not rigidly constrained with respect to the frame 11 due to the ability for the tension band 12 to deflect in the direction orthogonal to the length thereof.

Figure 3:
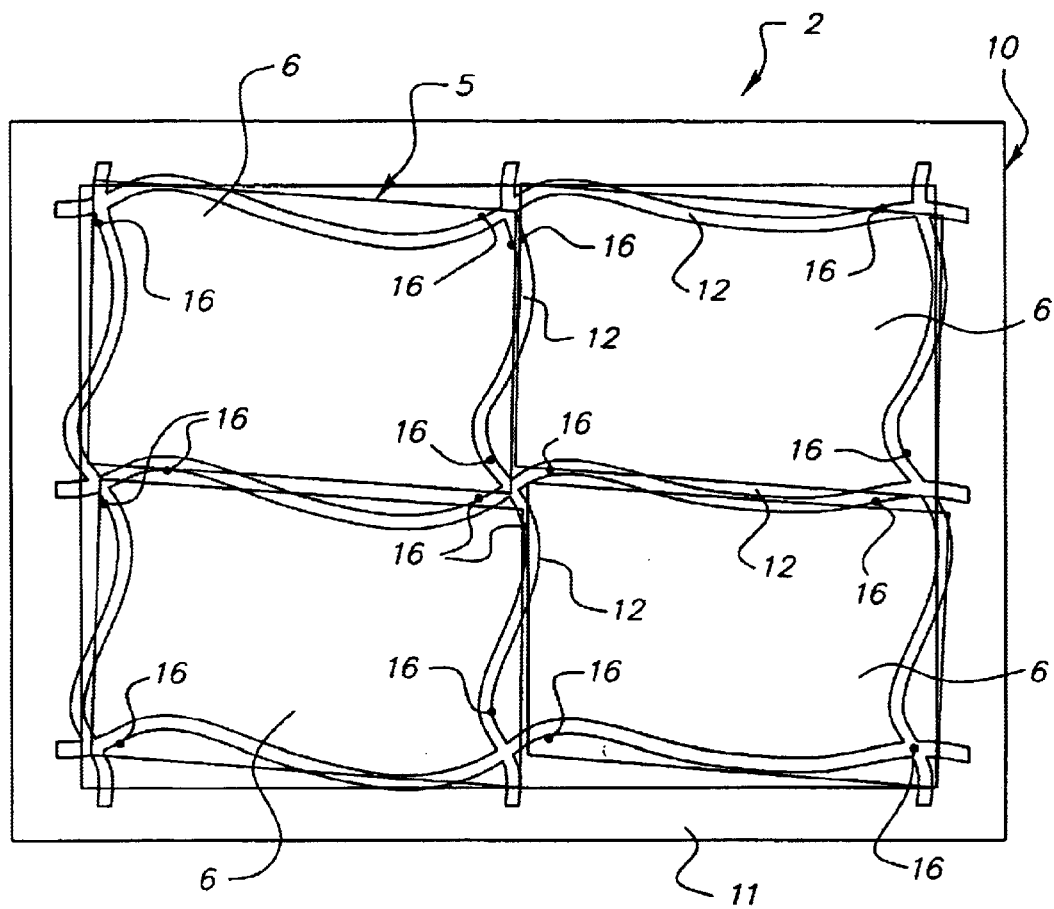
FIG. 3 is a top plan view of an exemplary shadow mask assembly of the present invention illustrating the movement (greatly exaggerated for purposes of illustration) of the mask sections (as predicted by a computer model) when the masks sections and band matrix of the shadow mask assembly are subjected to a rise in temperature.

FIG. 3 illustrates the movement (greatly exaggerated for purposes of illustration) of the mask sections 6 (as predicted by a computer model) when the masks sections 6 and band matrix are subjected to a rise in temperature. The attachment locations 16 and arrangement of the band matrix dictate the direction of movement of each mask section 6 when subjected to a temperature change sufficient to cause expansion. Note that the displacement of each mask section 6 is exaggerated and that each mask section 6 tends to expand and rotate about its respective center when subjected to a temperature change. As a result, the magnitude of error due to thermal expansion is dependent on the size of each individual mask section 6 but is not dependent upon the overall size of the shadow mask array 5. This allows the size of the frame assembly 10 to be scaled up without increasing the maximum thermal expansion movement of any point on the mask shadow mask array 5 as long the size of each mask section 6 is not increased. This, would, of course, require additional mask sections 6 to form a shadow mask array 5 having a larger area. Frame designs that result in mask growth about the center of the frame as opposed to center of individual mask sections 6 would not behave in this manner and therefore could not be scaled up in size without added thermal expansion effects.

Figure 5:
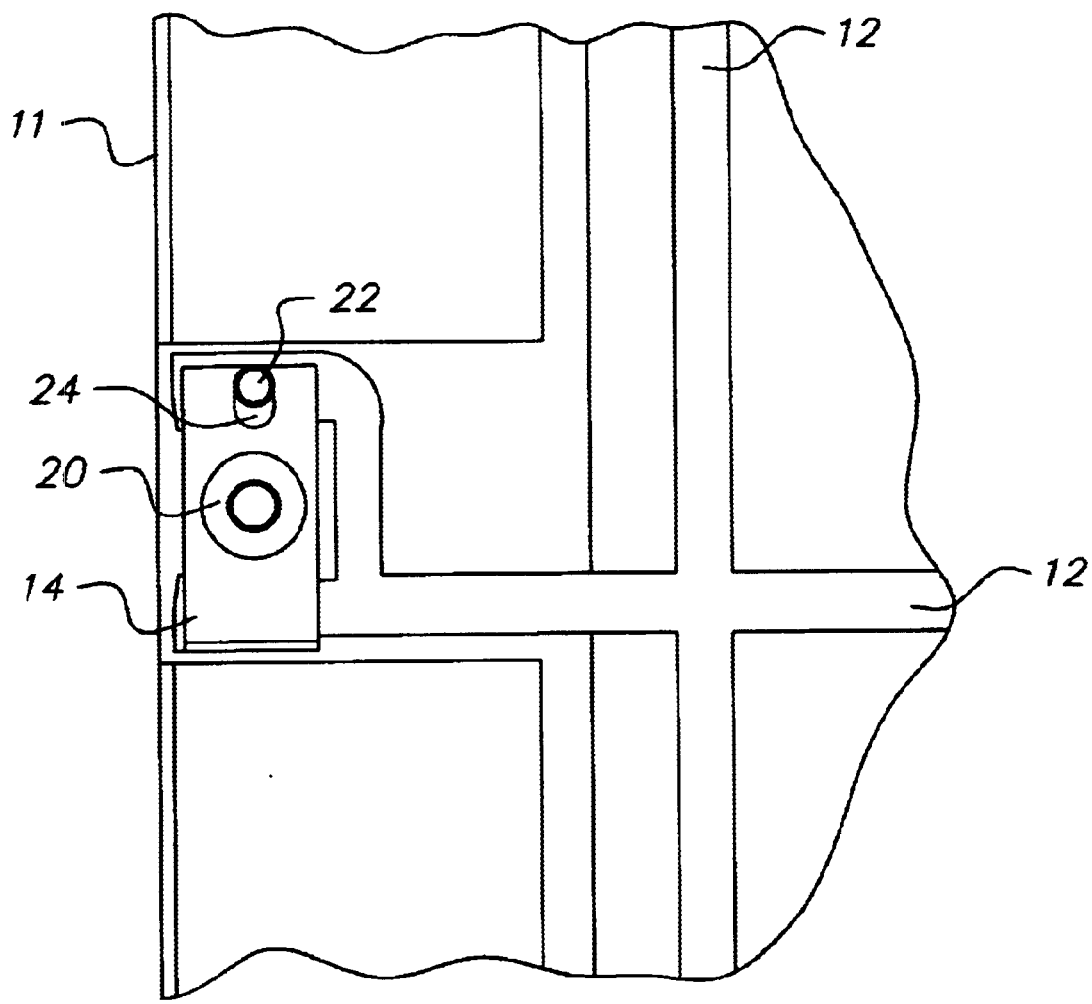
FIG. 5 is a detailed plan view enlargement of the edge of the frame with a clamp holding the end of a tension band thereto.

FIG. 5 shows an enlarged detail view of an exemplary clamp 14 positioned over one end of a tensioned band 12 on the top surface of frame 11 with a countersunk hole 20 for attachment with a flat head screw (not shown).

Note that there is a pin 22 residing in a slot 24 in clamp 14 to prevent rotation of clamp 14 during tightening of the screw. Pin 22 inserts into a bore (not shown) in frame 11.

The practice of the method of the present invention for making a shadow mask assembly 2 comprises the steps producing a plurality of shadow mask sections 6, inspecting the plurality of shadow mask sections 6 to determine which shadow mask sections 6 are within predetermined tolerances and acceptable, positioning a predetermined number of the acceptable mask sections 6 into predetermined locations relative to one another to form a shadow mask array 5 thereby distributing any error in individual mask sections 6 across the shadow mask section array 5, and attaching the individual mask sections 6 of the mask section array 5 to a frame 11 or support structure.

Fabrication of individual mask sections 6 is typically done by means of chemical etching of metal sheet stock such as, for example, Invar 36 or Alloy 42. Thickness of shadow masks used in vapor deposition processes is typically between 35 and 250 $\mu$m. An alternative method of producing shadow mask sections 6 is by electroplating. A common exemplary material used in the electroplating fabrication method for vapor deposition shadow masks is Nickel-Cobalt.

Inspection of individual mask sections 6 is typically done with a machine vision-based inspection system. Individual mask sections 6 are inspected for defects such as "plugged" mask coating apertures 8 as well as dimensional accuracy of the mask coating apertures 8. Shadow mask sections 6 are accepted or rejected based upon these criteria. Shadow mask sections 6 may also be rejected for other physical defects such as wrinkles, dents or level of curl.

Figure 6A:
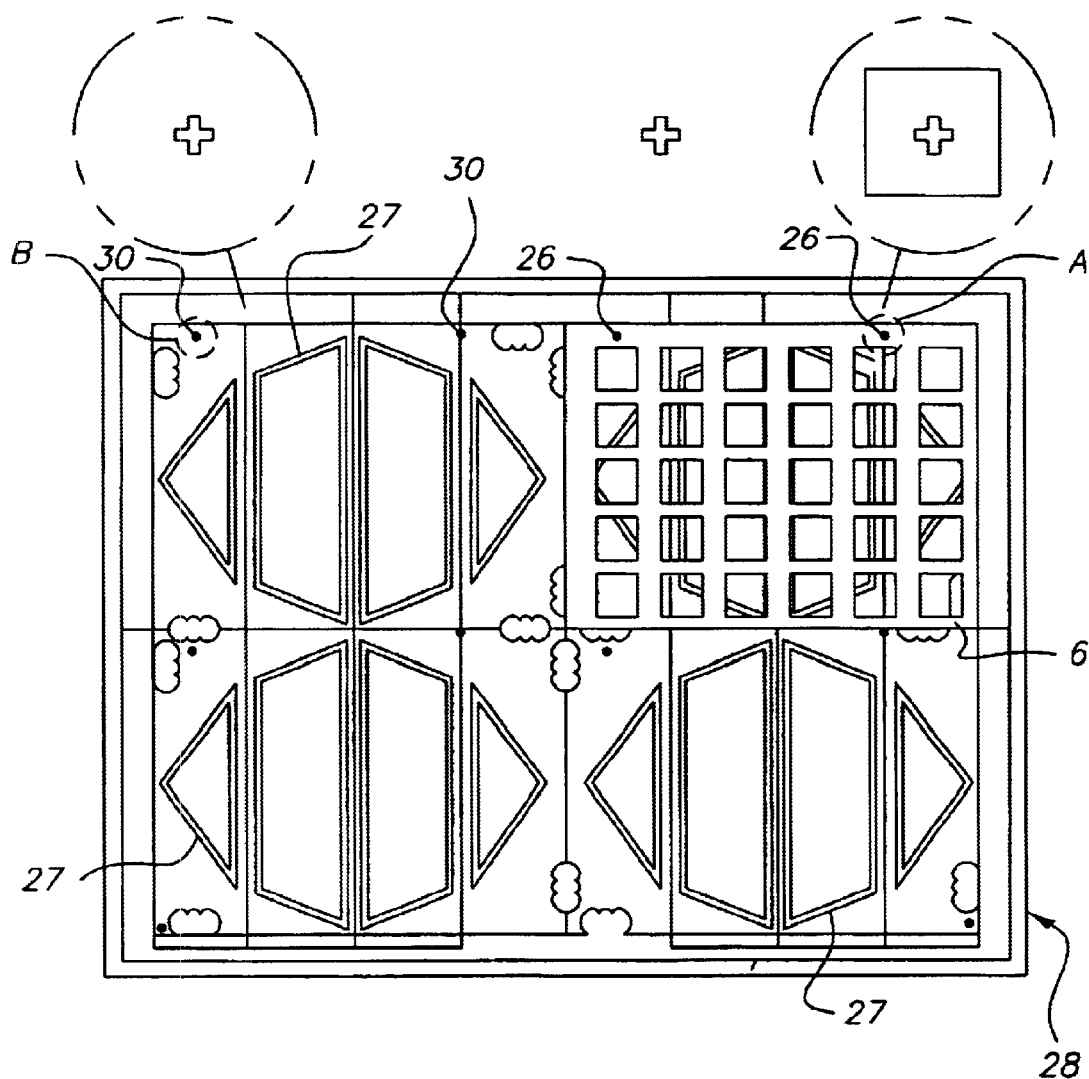
FIG. 6A is top plan view of a reference plate with one mask section residing thereon and used to position individual mask sections to form an array.

Referring to FIG. 6A, the individual mask sections 6 are positioned to form an array 5 by precisely aligning one or more predetermined mask fiducial apertures 26 common to all mask sections 6 to an accurate or precisely known reference plate 28. In the preferred method, the mask sections 6 are placed onto the top surface of a reference plate 28 comprising a glass plate with an accurate chrome pattern of alignment marks 30 on the upward facing surface of the glass plate 28. Alignment between the predetermined mask fiducial apertures 26 on the mask sections 6 and the pattern of alignment marks 30 on the reference plate 28 is accomplished with the aide of a machine vision-based measurement system. In the preferred method, the alignment marks 30 are smaller in size than the predetermined mask fiducial apertures 26 to facilitate ease of alignment inspection as viewed from above the mask section supported on the reference plate 28.

In general, the use of a pattern of alignment marks 30 permits a very small camera field of view for the cameras used to monitor the aligning process thereby substantially increasing the measurement resolution of the camera system. In one preferred embodiment there are two predetermined mask fiducial apertures 26 with a first predetermined mask fiducial aperture 26 located near one of the four corners of a mask section 6 and a second predetermined mask fiducial aperture 26 located near the corner of the mask section 6 diagonally opposite the first predetermined mask fiducial aperture 26. FIG. 6A shows an arrangement where the mask fiducial apertures 26 are both located on the same edge of the mask section 6 to provide easier access for robotic tooling to position mask sections 6 under the camera (s) used to monitor the alignment process. In either case, the predetermined mask fiducial apertures 26 are "best fitted" to the two corresponding and precisely located alignment marks 30 on the reference plate 28 during the alignment process.

Figure 8:
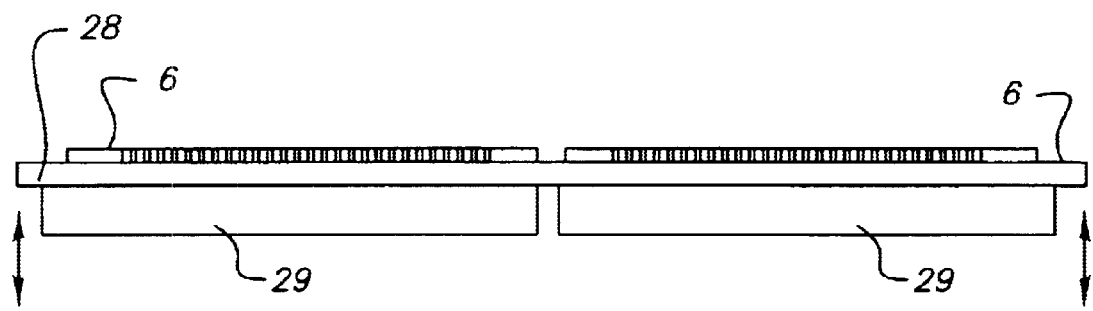
FIG. 8 is a side elevational schematic of a magnetic plate that is actuated into close proximity to the bottom surface of the reference plate opposite the mask section to hold shadow masks in an array for assembly.

In the preferred embodiment, aligned mask sections 6 are ferromagnetic. After each mask section 6 is aligned on the reference plate 28, each mask section 6 is held in place and flat by a magnetic plate 29 that is actuated into close proximity to the bottom surface of reference plate 28 opposite the mask section 6 as shown in FIG. 8. In an alternative embodiment, the means for holding an already-aligned mask section 6 in position comprises an electrostatic clamp 27 that is integrated into the upward facing surface 25 of the reference plate 28. The electrostatic clamp could be made by patterning a conductive coating such as chrome on the top surface of reference plate 28, which is covered by a dielectric coating. Electrostatic clamping technology is well-known in the silicone wafer handling industry. The use of this technology permits mask section material to be non-ferromagnetic. In yet another embodiment, the use of vacuum grooves in the upward facing surface of reference plate 28 could be used to clamp each aligned mask section 6 in place.

Once aligned to the patterned marks 30 on the reference plate 28 and clamped in place, mask sections 6 may be attached to each other in a way to not disturb the alignment between mask sections 6. This may be accomplished by various methods including the application of pieces of self-adhesive tape across adjacent mask sections 6, or by use of an adhesive and an intermediary material that is used to overlay and bridge the seam between mask sections 6 in the array 5. Preferably the mask sections 6 are attached to this intermediary material by means of welding, brazing, or soldering. If the attachment method is soldering, preferably a solder paste is used as is first applied to the surfaces of the aligned mask sections 6 to be joined at the desired joining locations. Application of a metal band matrix may then be placed over the applied solder paste followed by a heating process to re-flow the solder paste. The heating process is preferably achieved with a laser but may also be achieved by other heating methods such as a hot soldering iron. The preferred method for joining utilizes solder or solder paste. Unlike adhesive or welding type bonding methods, the use of solder permits detachment by means of re-flowing the solder with a heat source such as a hot bar, a laser or inductive heating source. This allows for replacement of individual mask sections 6 in a shadow mask array 5, which are subsequently found to have defects or are otherwise unacceptable after the array 5 has been assembled into a shadow mask assembly 2.

In a preferred embodiment, the band matrix comprises a predetermined number of individual bands 12 that are tensioned and attached at each end to a rigid support frame 11. In this preferred embodiment, the individual bands 12 are arranged in a pattern so that the individual bands 12 pass along all four edges of each mask section 6 in the mask section array 5. Preferably, the individual bands 12 are fabricated by chemical etching metal sheets such as Invar 36. In an alternative embodiment, the individual bands 12 are fabricated by means of electroplating from material such as NiCo. Preferably, however, all bands 12 needed to form part of the larger shadow mask assembly 2 are fabricated as a contiguous piece in the form of an integral band matrix fabricated from a single support sheet to facilitate the band-to-frame mounting process. Whether individual bands 12 or an integral band matrix is used, the ends of each band 12 are attached to the top surface of the rigid support frame 11 preferably by a mechanical clamping means comprising screws and clamp 14.

Prior to clamping, the individual bands 12 or the bands 12 of the integral band matrix, are tensioned by means of stretching. The preferred method to achieve uniform tensioning makes use of the thermal expansion properties of the material of the rigid support frame 11. In this method, the ends of the bands 12 are clamped to the rigid support frame 11 while the rigid support frame 11 is maintained at a temperature that is below ambient temperature. If the rigid support frame 11 is to be fabricated out of a material possessing a relatively high coefficient of thermal expansion (CTE) such as Aluminum and the bands 12 are to be fabricated out of a material with a relatively low CTE such as Invar 36, then the temperature of the frame 11 and bands 12 are typically lowered by 10° C. to 15° C. below ambient temperature just prior to clamping the bands 12 to the rigid frame 11. When the temperature of the frame 11 is raised back to ambient temperature, sufficient stretching and tensioning of the bands 12 occurs as the rigid fame 11 expands.

In an alternative embodiment, the rigid support frame 11 may be fabricated out of a low CTE material such as Invar 36. In this alternative embodiment, tensioning of the bands 12 is accomplished with the aid of a band-frame assembly fixture comprising integral springs that provide the forces needed to stretch the bands 12 prior to clamping. Another method of tensioning the bands 12 requires a band tensioning fixture made from a high CTE material such as aluminum. The ends of the bands 12 are temporarily attached to the band tensioning fixture after which the temperature of the band tensioning fixture is raised to above ambient temperature by an amount necessary to cause the desired stretching of the bands 12. While in this tensioned condition, the bands 12 are clamped by the clamps 14 to the rigid support frame 11, which is maintained at room temperature. As a final step, the bands 12 are released from the band tensioning fixture.

In all preferred embodiments, each mask section 6 is attached at three or four points 16 around the perimeter of each mask section 6. The positions of points 16 are chosen to provide the degree of compliance in the tensioned bands 12 in the direction that is orthogonal to their length that will allow thermal expansion without causing individual mask sections 6 to buckle or wrinkle. None of the attachment points 16 are located at any band intersection. In one preferred embodiment, each mask section 6 is attached at one point along three different edges of the rectangular mask section 6. With this arrangement, the position of mask section 6 can be accurately maintained in directions along the plane tangent to the mask section surface (X, Y, and rotation) while permitting the mask section 6 to change size due to thermal expansion of the mask section 6. Further, the positions of the attachment points 16 are chosen to control how the mask section 6 will shift and/or rotate during said thermal expansion in order to minimize the impact of these movements. In another arrangement, such as shown in FIG. 3 (with the attachment points 16 located proximate to the comers of each mask section 6), there would be no shift of the center position of the mask section 6, but each mask section 6 would be permitted to rotate about its center. While the arrangement that has no rotation might be preferred, it also has unattached corners that may cause problems in some processes. Therefore, design optimization for the positions of attachment points 16 must be made for best operation throughout the entirety of use of the mask assembly 2. If the mask sections 6 are held coplanar to the band matrix and flat, the compliance that is provided by the bands 12 will allow mask expansion or contraction to take place without causing buckling or wrinkling of the mask sections 6.

The shadow mask assemblies 2 of the present invention have particular use in the manufacture of organic light emitting diode (OLED) displays.

Through the use of the shadow mask assemblies 2 of the present invention, larger area substrates can be patterned with OLED material in a vapor deposition chamber. Further, the shadow mask assemblies 2 of the present invention minimize dimension variation and mask buckling due to changes in shadow mask temperature to allow for needed precision in patterning OLED materials.

From the foregoing, it can be seen that the present invention yields many advantages over the prior art. Overall pixel location errors are reduced by permitting the positioning of mask sections 6 in way to compensate for mask section 6 fabrication error. Overall pixel location errors are also reduced by permitting the positioning of mask sections 6 in a way that compensates for thermal expansion effects of substrate 4 and/or shadow mask array 5. Poor quality mask sections 6 can be sorted out prior to assembly of the shadow mask array assembly 2 to increase mask fabrication yield. A shadow mask assembly 2 that has a damaged mask section 6 can be repaired by merely removing a damaged mask section 6 replacing it with a new mask section 6 that meets inspection criteria.

From the foregoing, it will be seen that this invention is one well adapted to obtain all of the ends and objects hereinabove set forth together with other advantages which are apparent and which are inherent to the apparatus.

It will be understood that certain features and sub-combinations are of utility and may be employed with reference to other features and sub-combinations. This is contemplated by and is within the scope of the claims.

As many possible embodiments may be made of the invention without departing from the scope thereof, it is to be understood that all matter herein set forth and shown in the accompanying drawings is to be interpreted as illustrative and not in a limiting sense.

PARTS LIST 2 shadow mask assembly
4 substrate
5 shadow mask array
6 shadow mask section
8 coating apertures
10 frame assembly
11 rigid frame
12 individual bands
13 surface
14 clamps
16 attachment points
20 countersunk hole
22 pin
24 slot
25 upward facing surface
26 fiducial apertures
27 electrostatic clamp
28 reference plate
30 alignment marks

What is claimed is:

1. A method for making a shadow mask assembly comprising the steps of:
   (a) producing a plurality of shadow mask sections;
   (b) inspecting the plurality of shadow mask sections to determine which shadow mask sections are acceptable;
   (c) positioning a predetermined number of the acceptable mask sections into predetermined locations relative to one another to form a mask section array thereby distributing any error in individual mask sections across the mask section array; and
   (d) attaching the individual mask sections of the mask section array to a support structure to form the shadow mask assembly.

2. A method as recited in claim 1 wherein:
   the support structure allows for expansion and/or contraction of the individual mask sections of the mask section array while maintaining relative positioning of the individual shadow mask section in the mask section array.

3. A method as recited in claim 1 wherein:
   the support structure allows for compliance of the shadow mask array in a direction normal to the plane of the shadow mask array thereby allowing for a substantially planar interface between the shadow mask array and a substrate to be coated.

4. A method as recited in claim 3 wherein the support structure comprises:
   (a) a band matrix; and
   (b) a perimetric frame assembly, the band matrix being affixed to the perimetric frame assembly.

5. A method as recited in claim 4 wherein:
   the band matrix is integrally fabricated from a single sheet of material.

6. A method as recited in claim 4 wherein the band matrix comprises:
   (a) a first plurality of tension bands aligned in a first direction; and
   (b) a second plurality of tension bands aligned in a second direction orthogonal to the first direction thereby yielding a plurality of intersections, the first plurality of tension bands affixed to the second plurality of tension bands at the intersections thereof.

7. A method as recited in claim 4 wherein:
   wherein each mask section is attached to the band matrix and the step of attaching is performed by soldering at a plurality of predetermined attachment locations, the plurality of predetermined attachment locations permitting thermal expansion about a center of each mask section center to minimize thermal expansion movement of the mask.

8. A method as recited in claim 4 further comprising the steps of:
   (a) determining that there is a damaged mask section in the shadow mask assembly;
   (b) removing the damaged mask section from the shadow mask assembly; and
   (c) inserting a replacement mask section into the shadow mask assembly.

9. A method as recited in claim 8 further comprising the step of:
   attaching the replacement mask section to the shadow mask assembly.

10. A method for depositing a patterned material on a substrate comprising the steps of:
   (a) producing a plurality of shadow mask sections;
   (b) inspecting the plurality of shadow mask sections to determine which shadow mask sections are acceptable;
   (c) positioning a predetermined number of the acceptable mask sections into predetermined locations relative to one another to form a mask section array thereby distributing any error in individual mask sections across the mask section array;
   (d) attaching the individual mask sections of the mask section array to a support structure to form a shadow mask assembly;
   (e) placing the shadow mask assembly on a substrate in a deposition chamber; and
   (f) depositing a patterned material through the shadow mask assembly onto the substrate by vapor depsoition.

11. A method as recited in claim 10 wherein:
   the support structure allows for expansion and/or contraction of the individual mask sections of the mask section array while maintaining relative positioning of the individual shadow mask section in the mask section array.

12. A method as recited in claim 10 wherein:
   the support structure allows for compliance of the shadow mask array in a direction normal to the plane of the shadow mask array thereby allowing for a substantially planar interface between the shadow mask array and a substrate to be coated.

13. A method as recited in claim 12 wherein the support structure comprises:
   (a) a band matrix; and
   (b) a perimetric frame assembly, the band matrix being affixed to the perimetric frame assembly.

14. A method as recited in claim 13 wherein:
   the band matrix is integrally fabricated from a single sheet of material.

* * * * *